United States Patent [19]

Nathanson

[11] 4,316,103
[45] Feb. 16, 1982

[54] CIRCUIT FOR COUPLING SIGNALS FROM A SENSOR

[75] Inventor: Harvey C. Nathanson, Pittsburgh, Pa.

[73] Assignee: Westinghouse Electric Corp., Pittsburgh, Pa.

[21] Appl. No.: 39,416

[22] Filed: May 15, 1979

[51] Int. Cl.³ .......................................... H03K 3/353
[52] U.S. Cl. .................................. 307/304; 250/332; 250/349; 307/311; 307/522; 328/140
[58] Field of Search ............. 307/295, 233, 304, 311, 307/522, 523, 524; 328/140; 250/332, 349

[56] References Cited

U.S. PATENT DOCUMENTS

| | | | |
|---|---|---|---|
| 3,436,681 | 4/1969 | Hart | 307/304 X |
| 3,569,737 | 3/1971 | Bauer | 307/233 |
| 3,638,037 | 1/1972 | McMurtrie | 307/295 |
| 3,701,059 | 10/1972 | Nyswander | 307/295 |
| 3,716,730 | 2/1973 | Cerny, Jr. | 307/295 |
| 3,761,740 | 9/1973 | Naive | 307/524 |
| 3,805,091 | 4/1974 | Colin | 307/295 |
| 3,808,435 | 4/1974 | Bate et al. | 250/349 |
| 3,842,409 | 10/1974 | Mayer | 250/389 |
| 3,849,651 | 11/1974 | Ennulat | 250/349 |
| 4,004,148 | 1/1977 | Howard et al. | 250/349 |
| 4,112,316 | 9/1978 | Wentz | 307/311 |
| 4,143,269 | 3/1979 | McCormack et al. | 250/332 |
| 4,178,522 | 12/1979 | MacLennan et al. | 250/332 |

*Primary Examiner*—Saxfield Chatmon, Jr.
*Attorney, Agent, or Firm*—R. M. Trepp

[57] ABSTRACT

A circuit for use with sensors for providing background subtraction of signals below a predetermined frequency is described incorporating a first transistor for providing a zero to low frequency path and a second transistor or charge coupled device for providing a desired signal path wherein the $g_m$ of the first transistor is large compared to the $g_m$ of the second transistor or CCD device and the first transistor transconductance decreases at frequencies above the time constant determined by the gate capacitance of the first transistor and a resistor in series with the gate.

The invention overcomes the problem of large signals in relation to a desired signal during sensing of radiant energy such as infrared. In particular, large background signals tend to saturate signal storage shift registers during time delay integration or just time integration.

9 Claims, 11 Drawing Figures

CIRCUIT FOR COUPLING SIGNALS FROM A SENSOR

BACKGROUND OF THE INVENTION

1. Field of the Invention

This invention relates to circuits, and more particularly to a circuit which may be fabricated with each of a plurality of radiant energy detectors to form a sensor with improved characteristics, for example, subtraction of all background fluctuations below a predetermined rate in an infrared sensor.

2. Description of the Prior Art

One of the fundamental differences between infrared sensing and visual sensing is that in infrared sensing, a very large background photon flux exists which can be many thousands of times the desired signal to be detected. Because this large background signal may have both spacial and slowly varying temporal variations, it is necessary, particularly in staring space infrared sensors, to have some means subtracting of the fixed background signal at a per pixel level so that the scanning charge coupled device (CCD) which may be used to interface with the detector or an array of detectors is not overloaded. Overloading may occur, for example, in a CCD shift register used to accumulate charge from a number of detectors over a period of time during time delay integration (TDI). The subtraction of fixed or steady background signals in infrared sensors occurs automatically in pyroelectric vidicon type detectors, such as those which use tri-glycine sulfate (TGS) targets. In these pyroelectric targets, only the change in charge appears on the target lead.

In contrast, in present monolithic extrinsic silicon detector arrays, no inherent physical mechanism exists for subtracting off the background charge.

It is therefore desirable to provide a circuit for shunting portions of signals below a predetermined frequency and for providing the remaining signal above the predetermined frequency which may be utilized with a detector to provide fixed background subtraction.

It is further desirable to provide a circuit for fixed background subtraction which will not introduce excess noise, utilizes simple circuit elements and can be fabricated within the pixel size of a detector such as 0.05×0.05 mm.

It is further desirable to provide a circuit for fixed background subtraction which can operate at the lowest flux level anticipated for the detector.

It is further desirable to provide a circuit for fixed background subtraction which includes means for adjusting the roll-off frequency between cut-off and acceptance of the signal for transfer to the charge coupled output device such as from a tenth of a Hertz and below and at very low photon flux levels of approximately $10^{12}$ photons/cm$^2$ sec.

It is further desirable to provide a circuit for each detector of an array of detectors wherein the circuits may be fabricated as an integral part of the array.

SUMMARY OF THE INVENTION

In accordance with the present invention, a circuit for providing an output signal above a predetermined frequency in response to an input signal that may include portions having a frequency below such predetermined frequency is provided comprising means for coupling to an input signal, a first field effect transistor having a source, drain, gate and body, a second field effect transistor having a source, gate and body, the source and body of the first transistor and the source of the second transistor being commonly coupled to the input signal coupling means, the gate of the first transistor having a predetermined capacitance and coupled through a first resistor to its respective gate voltage source whereby the predetermined frequency is determined by the value of the gate capacitance and the first resistor, the drain of the first transistor coupled through a second resistor to a drain voltage source, the gate of the second field effect transistor coupled to its respective gate voltage source, means operative to govern the transconductance of the first transistor to be greater than the transconductance of the second transistor whereby greater amounts of signal current below the predetermined frequency conduct through the first transistor than conduct through the second transistor and greater amounts of signal current above the predetermined frequency conduct through the second transistor than conduct through the first transistor and wherein said signal current passing through the second transistor provides the output signal.

DESCRIPTION OF PREFERRED EMBODIMENTS

Figure 1:
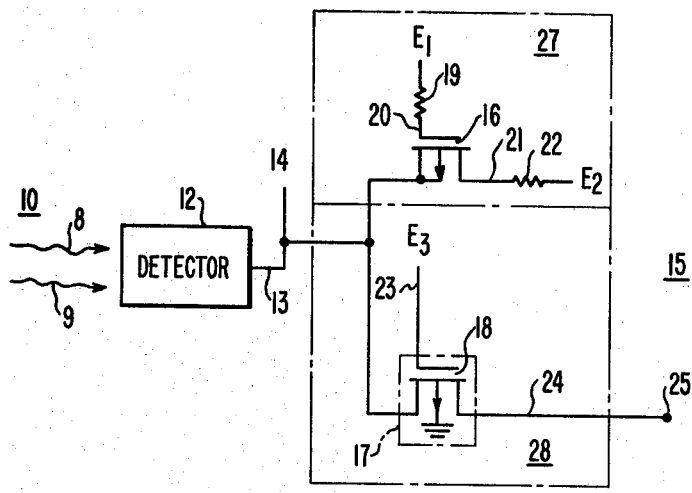
FIG. 1 is a schematic of one embodiment of the invention.

Referring to FIG. 1, radiant energy 10 is shown entering detector 12. Radiant energy 10 may for example be infrared radiation and detector 12 may for example be an extrinsic silicon detector. An output signal from detector 12 is coupled over line 13 to input terminal 14 of circuit 15. Terminal 14 is coupled over line 13 to the source and body of transistor 16 which may be for example a P channel MOS field effect transistor. Line 13 is also coupled to transistor 17 which has at least a source, gate and body. Transistor 17 may be for example a P channel MOS field effect transistor 18 as shown in FIG. 1. It is understood that transistor 17 may be implemented with a charge coupled device where the injection diode would be in place of the source of transistor 18. In FIG. 1, the gate of transistor 16 has a predetermined capacitance and is coupled through resistor 19 to its respective gate voltage source, $E_1$. It is understood that resistor 19 may, for example, be a variable resistance and may, for example, be the impedance between the drain and source of a field effect transistor. The drain of transistor 16 is coupled over line 21 through resistor 22 to a drain voltage source, $E_2$. The gate of transistor 17 is coupled over line 23 to its respective gate voltage source, $E_3$. As shown in FIG. 1, the drain of transistor 18 is coupled over line 24 to output signal terminal 25. The body of transistor 18 is coupled to ground.

In operation, the gate voltage source for transistor 16, $E_1$, may be −20 volts. The gate voltage source of transistor 18, $E_3$, may be −20 volts. The drain voltage source of transistor 16, $E_2$, may be −25 volts. The voltage on line 13 as determined by detector 12 may, for example, be −19 volts.

Circuit 15 includes means operative to govern the transconductance, $g_m$, of transistor 16 to be greater than the transconductance, $g_m$, of transistor 18. The transconductance of transistor 16 may be, for example, 30 times greater than the transconductance of transistor 18. Means operative to govern the transconductance of transistors 16 and 18 may be brought about by a difference in oxide thickness between the gate and body of the transistor, a difference in the gate voltage or a difference in the transistor periphery. The transconductance, $g_m$, of a transistor at low temperature such as 40° K. when the circuit 15 is combined with detector 12 is determined by equation 1, $$g_m = (q/KT)I_{DC} \quad (1)$$

where q is the charge of an electron, K is Boltzmann constant and T is the temperature in °K.

The gate capacitance of transistor 16 and resistor 19 form an RC circuit between the source and body of transistor 16 and gate voltage source, $E_1$. The gate capacitance of transistor 16 and resistor 19 provide an RC time constant or frequency above which the gate voltage on the gate of transistor 16 moves with the voltage of the body and source and of line 13 causing transistor 16 to be non-responsive. The frequency at which transistor 16 cannot respond to frequency components of a signal on line 13 is given by equation 2.

$$f = \tfrac{1}{2}\pi RX \cdot CDC \quad (2)$$

In equation 2, RX is the resistance of resistor 19 and CDC is the capacitance of the gate of transistor 16 and of line 20.

In operation, an input signal in the form of current on line 13 from detector 12 may have signal portions at various frequencies including a DC or zero frequency current. The input signal on line 13 is presented to common gate direct injection input circuits 27 and 28, similar to that found in the ordinary direct injection circuits used in monolithic extrinsic silicon detectors. Circuit 27, however, contains a resistor 19 in series with the capacitance of the gate of transistor 16. When the resistance of resistor 19 is 0, both circuit 27 and circuit 28 appear identical electrically to an input signal on line 13. The current on line 13 passing into circuit 27 leads to the drain of transistor 16 or a p+ sink, that is, all of the charge which goes towards circuit 27 goes into a sink and none appears in circuit 28. The current passing into circuit 28 on line 13 goes directly into transistor 17 which may be a charge coupled device where the signal would be in the channel of the CCD device. As shown in FIG. 1, the current passes into transistor 17 which includes transistor 18 and the current would appear on line 24 and on output terminal 25.

By adjusting the transconductance, $g_m$, of the two transistors 16 and 18, it is possible to achieve a difference in the low frequency current division between circuits 27 and 28, such that the current would divide according to the ratio of the two $g_m$ values at low frequencies. When the frequency of the current in the input signal becomes high, relative to the RC time constant of resistor 19 and the capacitance of the gate of transistor 16, all of the current at the higher frequency will flow to circuit 28 through transistor 18 and appear on line 24. The reason for this is that for high frequencies above the RC time constant of circuit 27, it appears as though the gate of transistor 16 is floating. Under these conditions, only constant current or low frequency current can flow into circuit 27 through transistor 16. Higher frequency current on line 13 is then forced into circuit 28 and transistor 17. By varying the value of resistor 19, it is possible to vary the frequency at which the current stops going into transistor 16 and begins to go into transistor 17. For example, for many sensor staring applications, an RC value for circuit 27 of 0.1 Hz would be appropriate. For frequencies below 0.1 Hz, most of the current will go to circuit 27 providing the $g_m$ of transistor 16 is much greater than the $g_m$ of transistor 17. For frequencies above 0.1 Hz, most of the current will go to circuit 28 and directly into transistor 17 since circuit 27 and more specifically transistor 16 cannot respond to currents above the RC time constant or the predetermined frequency of equation 2.

Figure 2:
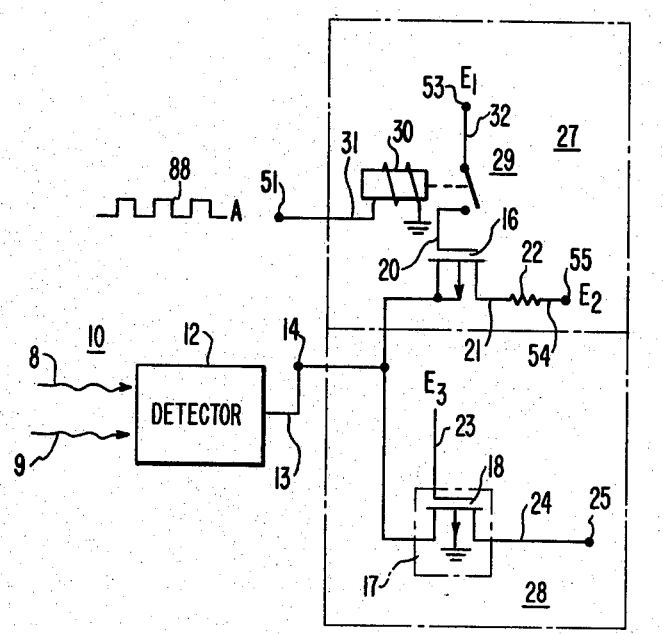
FIG. 2 is a schematic of an alternate embodiment of the invention.

FIG. 2 shows an alternate embodiment of the invention. In FIG. 2, like references are used for functions corresponding to the functions of the embodiment of FIG. 1. In FIG. 2, the gate of transistor 16 is coupled over line 20 to one side of switch 29. The other side of switch 29 is coupled over line 32 to terminal 53 and gate voltage source $E_1$. Solenoid 30 functions in response to control signal A on line 31 to open and close switch 29. Switch 29 may be, for example, an MOS field effect transistor. Switch 29 in conjunction with solenoid 30 should be capable of turning on and off switch 29 at a predetermined frequency as determined by control signal A on line 31.

In operation, the voltage of $E_1$ may, for example, be −20 volts and the voltage of $E_3$ may, for example, be −18 volts to achieve a transconductance ratio between transistor 16 and 18. The voltage of $E_2$ may, for example, be −25 volts. With switch 29 closed and with the transconductance of transistor 16 much greater than the transconductance of transistor 18 all the current or substantially all the current will pass through transistor 16 according to the ratio of the transconductances. Switch 29 is now opened by control signal A. The current passing through transistor 16 is now locked or constant due the fact that the gate is now floating and will follow the source voltage. The gate to source voltage of transistor 16 will remain the same. Any additional current from detector 12 will have to flow through transistor 18. The effective RC time constant of circuit 27' is now the DC sampling repetition rate of switch 29.

Figure 3:
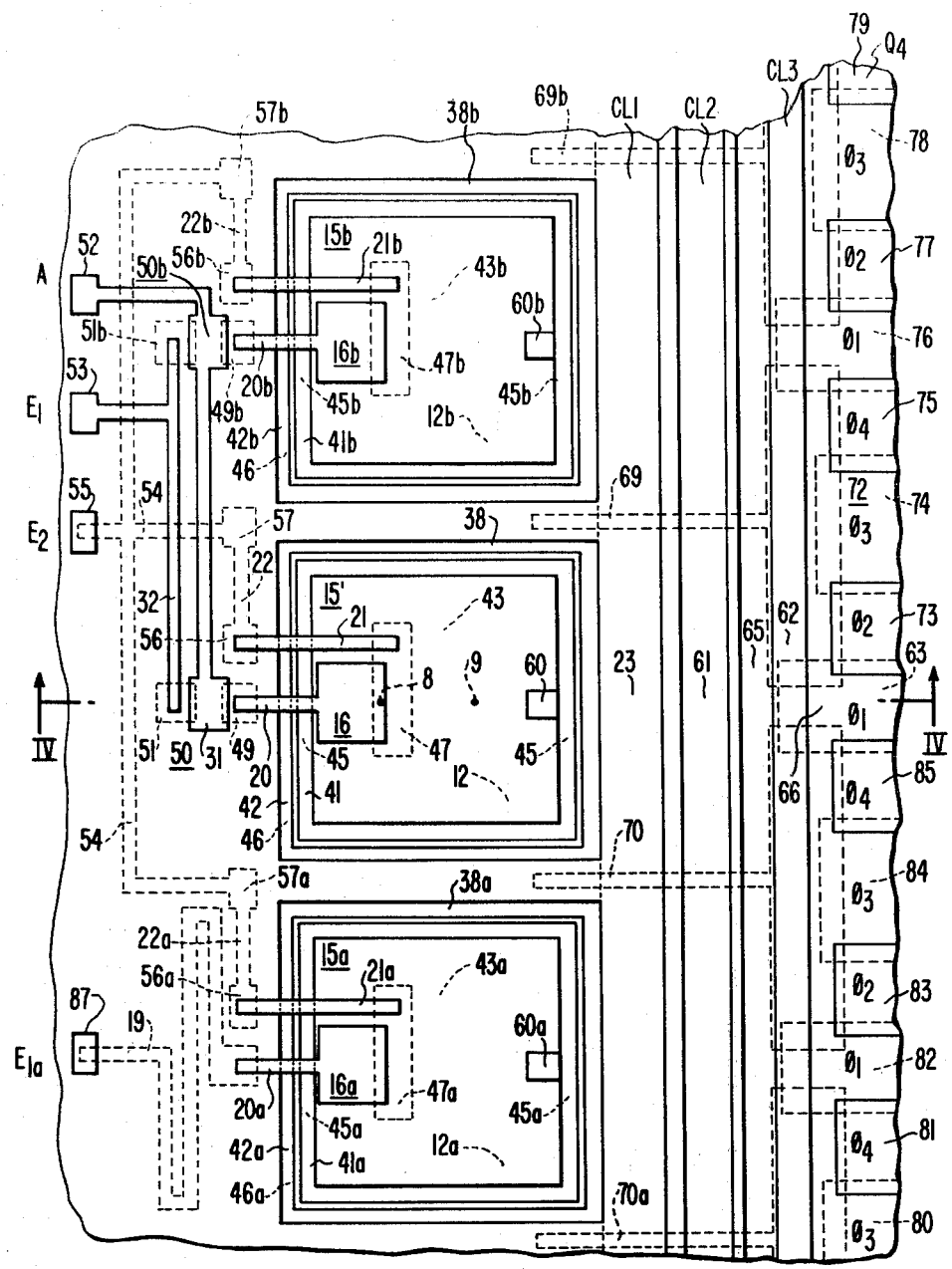
FIG. 3 is a plan view of an array of detectors each incorporating an embodiment of the invention.
Figure 4:
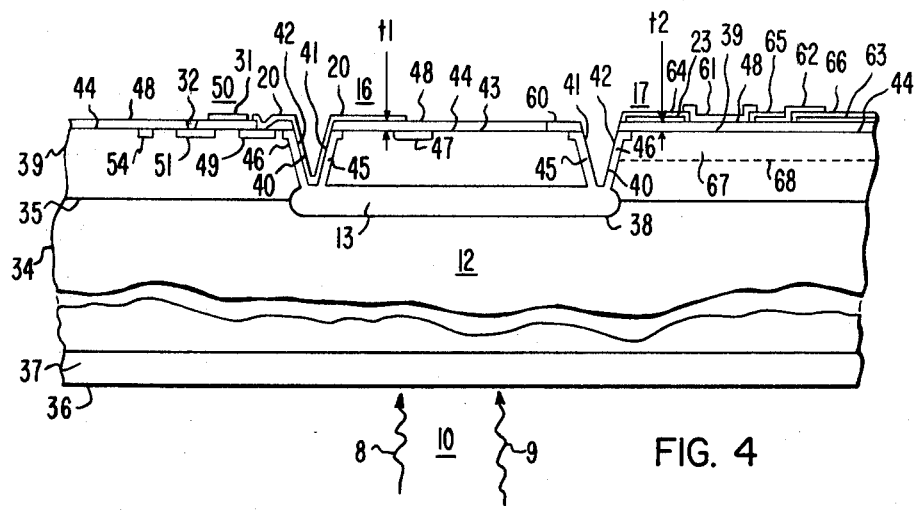
FIG. 4 is a cross-section along the lines IV—IV of FIG. 3.

FIG. 3 shows a plan view of an array of detectors each incorporating an embodiment of the invention. In FIG. 3, like references are used for functions corresponding to the apparatus of FIGS. 1 and 2. FIG. 4 is a cross section along the lines IV—IV of FIG. 3. Referring now to FIS. 3 and 4, radiation 10 is depicted by arrows 8 and 9 is shown entering detector 12 which includes substrate 34 having an upper surface 35 and a lower surface 36. Substrate 34 may, for example, be silicon doped with indium to form an extrinsic silicon material. A p+ layer 37 is formed in lower surface 36. A p+ layer 38 is formed in upper surface 35. A radiant energy detector is formed in the volume between p+ layer 37 and 38 which may be biased with 40 volts therebetween. On upper surface 35 is formed an n type epitaxial layer 39. A groove 40 having sidewalls 41 and 42 is formed in epitaxial layer 39 which may extend and close upon itself to form an enclosed area of silicon material 43. Epitaxial layer 39 has an upper surface 44. A p+ diffusion in groove 40 from upper surface 44 forms p+ diffusions 45 and 46 on either side of groove 40 within sidewalls 41 and 42, respectively, which extend and connect to p+ layer 38. p+ diffusions 38, 45, and 46 are all coupled together electrically and form a low impedance path for carrying electric current as line 13 in FIG. 1. Transistor 16 is formed in enclosed area 43 with p+ diffusion 45 acting as its source, enclosed area 43 acting as its body and p+ diffusion 47 acting as its drain. The gate of transistor 16 is formed by line 20 which extends over and between p+ diffusions 45 and 47 and insulated from enclosed area 43 by dielectric 48. Dielectric 48 may, for example, be silicon dioxide. Dielectric 48 is a layer on upper surface 44 of n type layer 39.

The gate of transistor 16 is coupled over line 20 over groove 40 to p+ diffusion 49 of transistor 50 which functions as switch 29 of FIG. 2. The other side of transistor 50 is p+ diffusion 51 which is coupled to line 32. Transistor 50 is controlled by the potential on line 31 which also forms the gate of transistor 50. Line 31 is coupled to terminal 52 which is coupled to a control signal A for turning on and off transistor 50. Line 32 is coupled to terminal 53. The drain of transistor 16, p+ diffusion 47 is coupled over line 21 across groove 40, through resistor 22 and over line 54 to terminal 55 which is coupled to a drain voltage source $E_2$. Resistor 22 extends between p+ diffusions 56 and 57 and may be itself a p+ diffusion having a length to width ratio to provide the desired resistance.

The source of transistor 16, p+ diffusion 45 is coupled to the body of transistor 16 by a conductor path through p+ diffusion 38, p+ diffusion 45 and conductor 60. Conductor 60 which may, for example, be aluminum, may form an ohmic contact with enclosed area 43 and p+ diffusion 45.

Current from detector 12 on line 13, diffusion 38 of FIG. 3, may also pass over diffusion 46 to the source of transistor 17 or charge coupled device 17. In a charge coupled device, the source is called an injection diode. The gate is formed by metallization 23 which may, for example, be aluminum, which may be coupled to the gate voltage source, $E_3$ as shown in FIGS. 1 and 2. Dielectric layer 48 provides the dielectric layer for charge coupled device 17 between gate 23 and n type layer 39. Additional charge coupled device gates function to transfer charge from under gate 23 to under gate 63. Gates 23 and 61 are isolated from one another by dielectric layer 64 which may, for example, be silicon dioxide. Gates 61 and 62 are isolated by dielectric layer 65 which may, for example, be silicon dioxide. Gates 62 and 63 are isolated by dielectric layer 66 which may, for example, be silicon dioxide. Charge couple device 17 may have a channel 67 between dashed line 68 and upper surface 44. The potential wells in the channel are dependent upon the voltage on gates 23 and 61 through 63. The extent of channel 67 in the direction of the gate electrodes is limited by p+ in FIG. 3 which are diffused into n type layer 39. p+ diffusion 69 and 70 in conjunction with a potential on the gate electrodes function to contain the charge within a limited area for transfer of charge from gate 23 to under gate 63 via transfer gates 61 and 62. When the charge passes to gate 62, the charge is concentrated between a narrower distance between p+ diffusion 69 and 70 such that when charge passes from under gate 62 to under gate 63, the charge may be entered into one bit of a charge coupled device shift register which functions to shift the charge parallel to gate electrode 62. Gate 23 in conjunction with p+ diffusion 46 functions as a direct injection transistor having a transconductance for drawing current from line 13. Gates 61 through 62 function to transfer charge which has accumulated under gate 23 to under gate 63 of a charge coupled device shift register 72.

One stage of shift register 72 includes gates 63, 73, 74 and 75 where each gate is coupled to one phase of a four-phase clock for shifting data or charge below gate 63 to another stage of the shift register which is well known in the art. A second stage of the shift register may include gates 76 through 79. Other gates shown in FIG. 3 forming part of shift register 72 are gates 80 through 85. The gates are coupled in sequence to a phase of the four phase clock which results in the transfer of the charge in sequence along the shift register which is well known in the art.

FIG. 3 shows additional detectors 12a and 12b to form an array of detectors. Detector 12a has associated with it circuit 15a for providing background subtraction. Detector 12b has circuit 15b for providing background subtraction. In circuit 15b, like references labeled with the suffix b are identical in structure and function as reference numbers in circuit 15 shown in FIG. 2 without the suffix. Circuit 15a conforms to the schematic circuit of FIG. 1 which differs from circuit 15' in that resistor 19 is substituted in place of transistor 50. In FIG. 3, resistor 19 is shown coupled to terminal 87 which is coupled to a gate voltage source $E_{1a}$. In circuit 15a, like references labeled with the suffix a are identical in structure and function as reference numbers in circuit 15 without the suffix.

Figure 5:
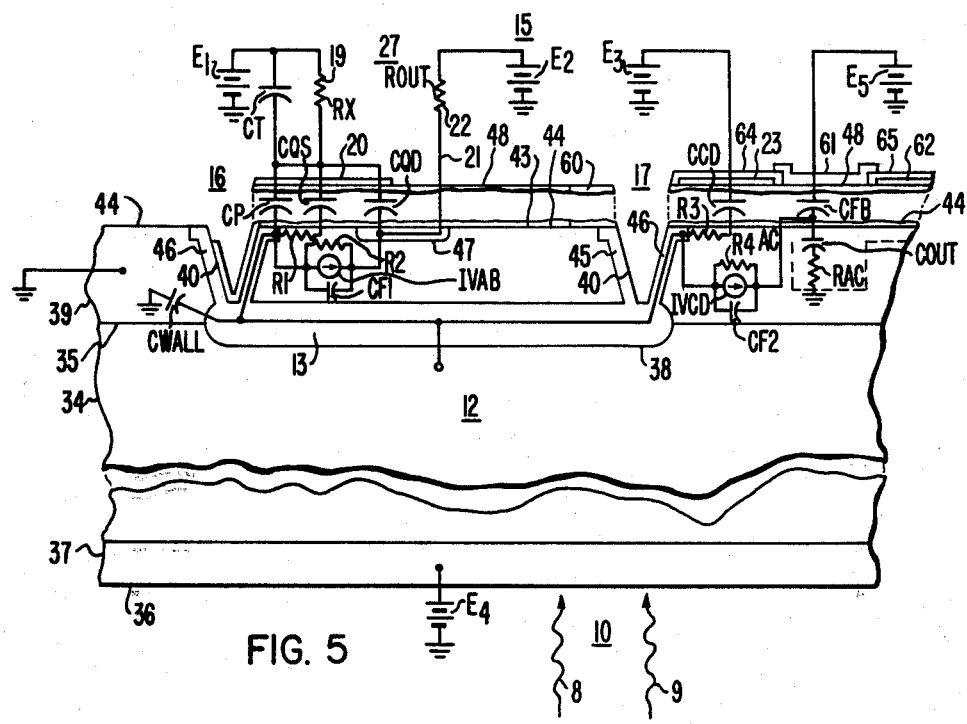
FIG. 5 shows a circuit schematic for simulation of the circuit of FIG. 1 fabricated in integrated circuit form as shown in FIGS. 4 and 5.

FIG. 5 shows a circuit schematic for simulation of the circuit in FIG. 1 fabricated as shown in FIGS. 4 and 5. As stated previously, signal current from detector 12 enters node 1, p+ layer 38, and then divides and appears as an input at the sources of transistors 16 and 17 whose transconductance, $g_m$, is designated IVAB and IVCD, respectively. As can be seen, the gate 20 of transistor 16 is grounded through a resistance 19 connected between nodes 0 and 4. In contrast, the gate of transistor 17 appears grounded directly to node 0 through gate voltage source $E_3$, no resistance being interposed to AC signals. The gate capacitance of transistor 17 is designated CCD. Various capacitances and resistors appear in FIG. 5 simulating, among other things, CWALL, the p+ diffusion 46 to n layer 39 capacitance. Capacitance CQD is the drain to gate capacitance of transistor 16. Capacitance CT is the capacitance across resistor 19, RX, from end to end. For example, if RX is long, the direct capacitance between ends would be small. Capacitance CP is the gate-to-source capacitance of transistor 16. Capacitance CP may be augmented by making the gate-to-source overlap area large. Capacitance COUT is the capacitance of the output well underneath gate 61. Other parasitic capacitances which are self-explanatory are shown in FIG. 5 in addition. As shown in FIG. 5, transistor 16 is isolated in its own enclosed area 43 or tub. Groove 40 which is V-shaped completely surrounds all four sides of transistor 16 as shown in FIG. 3. In this manner, the output impedance of transistor 16, illustrated by the resistance R2 in FIG. 5, can be kept quite high, such that the amplification factor of transistor 16 is on the order of 200 or more. In contrast, if enclosed area 43 or the body of transistor 16 were at real ground potential, the output impedance R2 may be sufficiently small as to preclude proper operation of circuit 27. The decrease in the output impedance, R2, of transistor 16 would be due to the AC substrate gating effect exerted by the relative potential between node 1 and the substrate, enclosed area 43. With enclosed area 43 isolated, the substrate or body of transistor 16 can be permanently tied to the source of transistor 16 to eliminate AC gating from the substrate.

Figure 6:
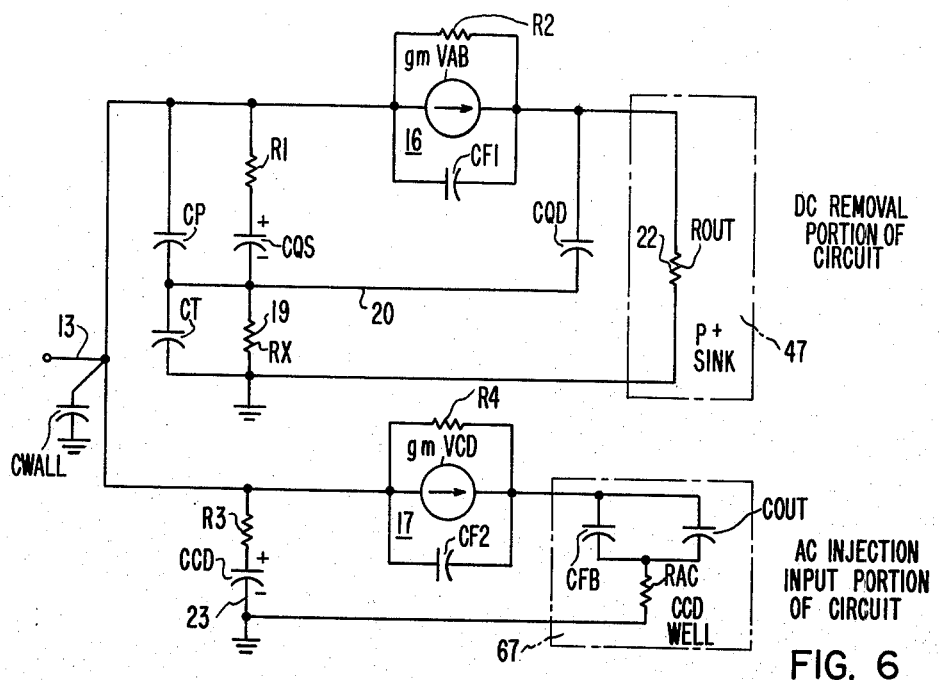
FIG. 6 shows the equivalent circuit of FIG. 5 for AC decoupling.

FIG. 6 shows the equivalent circuit of FIG. 5 for AC decoupling. All of the corresponding nodes illustrated in FIG. 5 are marked in FIG. 6. The CCD acceptance well underneath electrode 61 is simulated by CFB and COUT in parallel, feeding a 1 ohm current sense resistor between nodes 0 and 7. Other typical values of capacitances and resistors in the equivalent circuit in FIG. 6 are inserted to realistically simulate the parasitics associated with the operation of circuit 15.

An important capacitance CQD or drain to gate capacitance of transistor 16 should be minimized if node 4 line 20 in FIG. 1 is to truly float when high values of resistor 19 are used. Unless capacitance CQD can be kept to a low value, the performance of circuit 15 will be reduced. Additionally, capacitance CT between node 4 and ground or the capacitance across the resistor 19, should be small to enhance proper operation of circuit 15.

Figure 7:
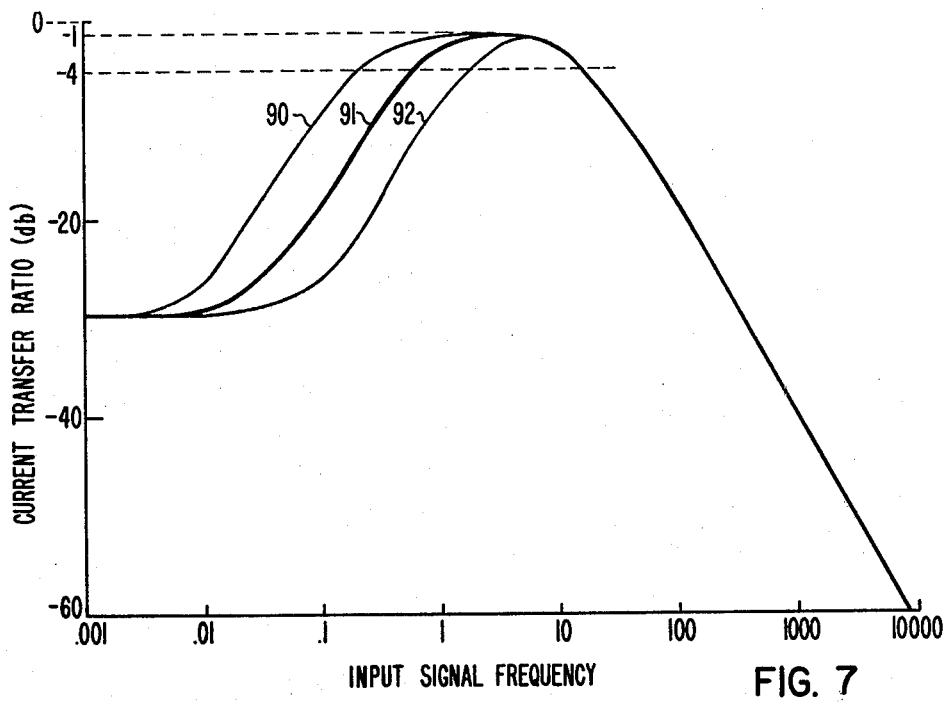
FIG. 7 shows curves of the current transfer ratio of the two transistors in the circuit versus the input signal frequency.

FIG. 7 shows curves 90, 91 and 92 of the current transfer ratio of the two transistors 16 and 17 in circuit 15 versus the input signal frequency. FIG. 7 illustrates the results of an actual computer simulation of the circuit shown in FIG. 6. In this particular simulation, a realistic background flux of $10^{12}$ protons/cm$^2$ sec. was used. In addition, an F/2 lens system and a ratio of transconductance of transistor 16 to transistor 17 of 30 to 1 was utilized. All parasitics were neglected in the simulation shown in curves 90, 91 and 92 in FIG. 7. Three different roll-off frequencies were simulated by varying the value of resistor 19. Curve 90 simulates a roll-off frequency of 0.01 Hz. Curve 91 simulates a roll-off frequency of 0.03 Hz. Curve 92 simulates a frequency of 0.1 Hz. In many spacecraft scenarios, the approximate frequency of drift due to spacecraft instability, line of sight deviation, can be on the order of 0.03 Hz. On the other hand, signal frequencies in space generally occur from 1 and 10 Hz when infrared radiation is sensed. It can be seen from curve 91 in FIG. 7 that when the parasitics are neglected and a $g_m$ ratio of 1:30 are used content with a photon flux of $10^{12}$ photons/cm$^2$ seconds, the circuit indeed operates with a 3 dB bandwidth between 0.8 and 18 Hz, with a 1 dB insertion loss and a 20 dB attenuation at 0.1 Hz. Circuit 15 can thus be very useful for providing background subtraction where low frequency subtraction is important such as in infrared sensing. In FIG. 7, the ordinate represents current transfer ratio in decibels and the abscissa represents input signal frequency in hertz.

Figure 8:
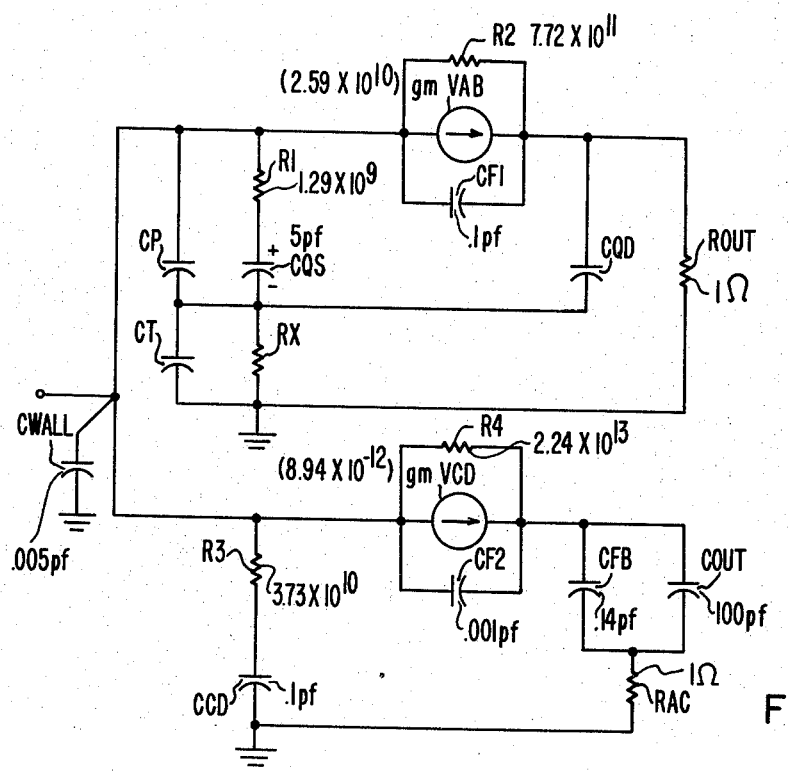
FIG. 8 shows a detail equivalent circuit of FIG. 6 with selected typical values for parasitic capacitances.
Figure 9:
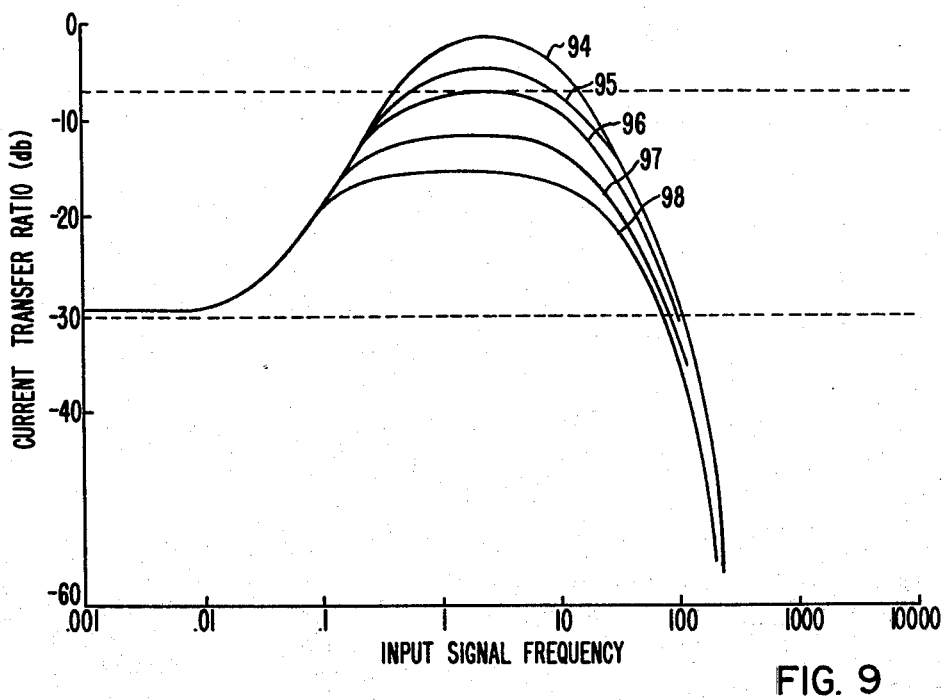
FIG. 9 shows curves for the current transfer ratio versus input signal frequency for various capacitances of CQD utilizing the equivalent circuit of FIG. 8.

FIG. 8 shows a detailed equivalent circuit of FIG. 6 where typical values for parasitic capacitances and resistances are used. The particular parasitic values selected are consistent with those which would be obtainable in an integrated circuit device having a pixel size of 0.0076 by 0.0076 centimeters. In FIG. 6, the allowable value of capacitance CQD, the drain to gate capacitance of transistor 16 was considered. If capacitance CQD is too large, the gate of transistor 16 at node 4 will not float up and down in voltage with the input signal on the transistor 16. The current through transistor 16 in this case will not be constant or steady but will, in fact, follow the input signal. This will result in poor AC injection transfer. The midband injection gain of the overall device is shown in FIG. 9. In FIG. 9, curves for the current transfer ratio versus input signal frequency for various capacitances of CQD utilizing the equivalent circuit of FIG. 8 is shown. With capacitance CQD equal to zero picofarads, a fairly acceptable bandpass with a 30 dB attenuation at low frequencies is possible as shown by curve 94. Increasing values of capacitance CQD attentuate the midband bandpass of the device as shown by curves 95 through 98 for a capacitance of 0.01, 0.05, 0.1 and 0.2 picofarads respectively. As can be seen in FIG. 9 for increasing values of capacitance CQD, the operation of the circuit degrades. Values of capacitance CQD such as 0.01, curve 95, to 0.05 picofarads, curve 96, seem acceptable. These values will limit the midband attenuation to less than around 4 dB.

Figure 10:
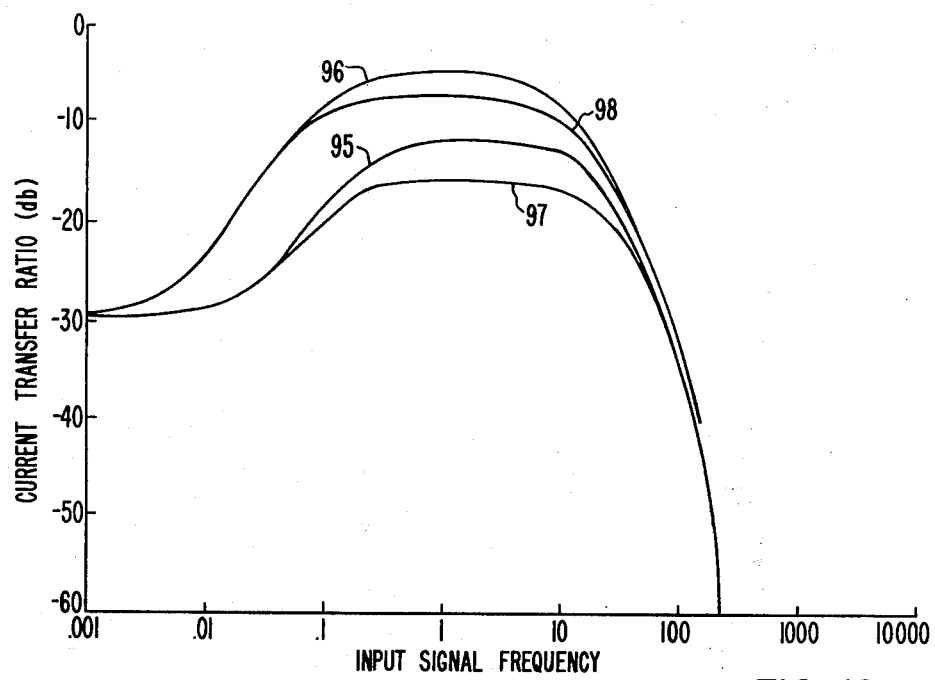
FIG. 10 shows curves for the current transfer ratio versus input signal frequency for various capacitances of CQD and CP utilizing the equivalent circuit of FIG. 8.
Figure 11:
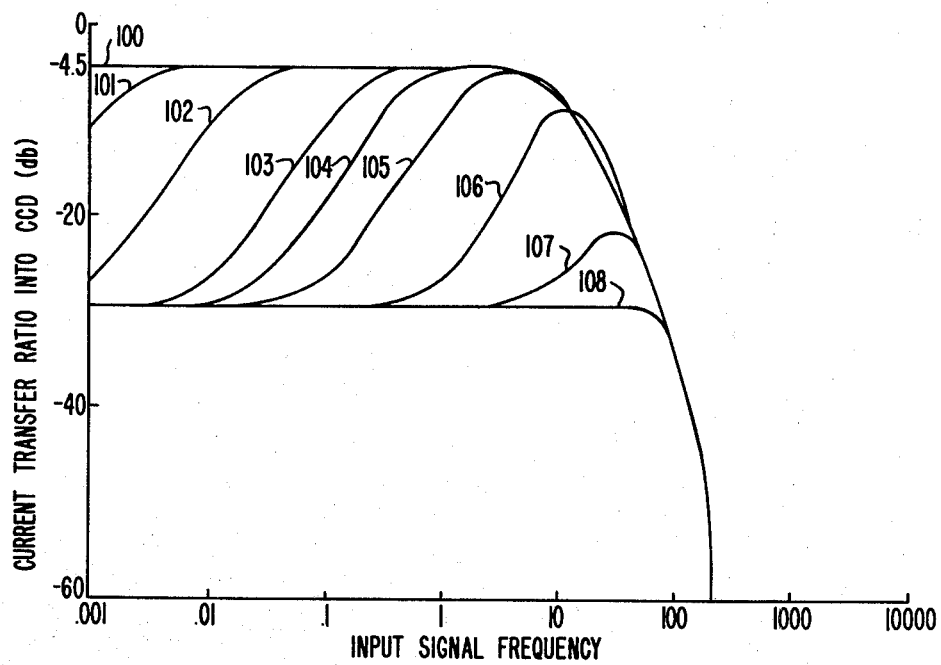
FIG. 11 shows curves for the current transfer ratio versus input signal frequency for various RC time constants utilizing the equivalent circuit of FIG. 8 and utilizing a complete set of typical values for parasitic capacitances.

By making capacitance CP larger, it is possible to hold node 4 very close to the source voltage, node 1. FIG. 10 shows curves for the current transfer ratio versus input signal frequency for various capacitances of CQD and CP utilizing the equivalent circuit of FIG. 8. In FIGS. 9, 10 and 11, the ordinate represents current transfer ratio in decibels and the abscissa represents input signal frequency in hertz. In FIG. 10, the positive effective of having larger values of capacitance CP when non-zero values of capacitance CQD can be seen by the improvement from curve 95 to curve 96 where capacitance CQD is 0.05 picofarad and capacitance CP is 0 picofarad for curve 95 and 2 picofarads for curve 96. A positive effect can also be seen by the improvement from curve 97 to curve 98 where in curve 97 capacitance CQD is 0.1 picofarad and capacitance CP is 0 picofarads and in curve 98 capacitance CQD is 0.1 picofarad and capacitance CP is 2 picofarads. For curves 95 through 98 in FIG. 10, the value of resistor 19, RX, is approximately $1.05 \times 10^{13}$ ohms and capacitance CT is 0.0001 picofarads. As can be seen in FIG. 10, changes in the capacitance CP from 0 to 2 picofarads markedly increases the midpass gain in the condition when capacitance CQD is 0.1 picofarad. The increase in gain is also of utility when capacitance CQD equals 0.5 picofarad. For best operation of circuit 15, values of capacitance CP should be utilized which are large as are consistent with the size of the unit cell detector 12 and the high frequency requirements of the removal part of the circuit, namely transistor 16. Since the roll-off frequency is seldom larger than 1 hertz, the bounding value on capacitance CP will generally be the area available in the unit cell, detector 12, to make it large. In particular, values of capacitor CP are on the order of 0.2 picofarad which seems reasonable and it can be shown that such values will result in midband injection losses less than 4 dB in the actual operation of the circuit. It is significant that values of CP=0.2 picofarads can be easily obtained in areas on the detector focal plane sufficiently small to be fabricated in the space assigned to a single detector. Thus one AC coupling circuit per detector is possible with this circuit where the pixel size of the detector may be, for example, 0.05×0.05 mm and on 0.05 mm center to center spacing.

FIG. 11 shows curves for the current transfer ratio versus input signal frequency for various RC time constants utilizing the equivalent circuit of FIG. 8 and utilizing a complete set of realistic values for parasitic capacitances. In FIG. 11, the transconductance ratio between transistors 16 and 17 is 30, the capacitance CQD is 0.0025 picofarad and the insertion loss is 4.5 db. The capacitance CWALL is 0.065 picofarad. The capacitance CP is 0.2 picofarad. In FIG. 11, the roll-off frequency is determined by equation (2) where RX is the value of resistor 19 and capacitance CDC is equivalent to capacitance of the gate of transistor 16 or node 4. Curve 100 represents the case for a roll-off frequency of 0 Hz. Curves 101 through 108 represent responses for roll-off frequencies of 0.0001, 0.001, 0.01, 0.03, 0.1, 1.0, 10.0, and infinity, respectively.

A circuit for providing an output signal above a predetermined frequency in response to an input signal that may include portions having a frequency below such predetermined frequency has been described incorporating means for coupling to an input signal, a first field effect transistor having a source, drain, gate, and body, a second field effect transistor having a source, gate and body, the source and body of the first transistor and the source of the second transistor being commonly coupled to the input signal coupling means, the gate of the first transistor having a predetermined capacitance and coupled through a first resistor to its respective gate voltage source whereby the predetermined frequency is determined by the value of the gate capacitance and the first resistor, the drain of the first transistor coupled through a second resistor to a drain voltage source, the gate of the second field effect transistor coupled to its respective gate voltage source, means operative to govern the transconductance of the first transistor to be greater than the transconductance of the second transistor whereby greater amounts of signal current below the predetermined frequency conduct through the first transistor than conduct through the second transistor and greater amounts of signal current above the predetermined frequency conduct through the second transistor than conduct through the first transistor and wherein the signal current passing through the second transistor provides the output signal.

What is claimed is:

1. A circuit for providing an output signal above a predetermined frequency in response to an input signal that may include portions having a frequency below said predetermined frequency, comprising:
    means for coupling to an input signal;
    a first field effect transistor having a source, drain, gate and body;
    a second field effect transistor having a source, gate and body;
    said source and body of said first transistor and said source of said second transistor being commonly coupled to said input signal coupling means;
    said gate of said first transistor having a predetermined capacitance and coupled through a first resistor to its respective gate voltage source whereby said predetermined frequency is determined by the value of said gate capacitance and said first resistor;
    said drain of said first transistor coupled through a second resistor to a drain voltage source;
    said gate of said second field effect transistor coupled to its respective gate voltage source;
    means operative to govern the transconductance of said first transistor to be greater than the transconductance of said second transistor whereby greater amounts of signal current below said predetermined frequency conduct through said first transistor than conduct through said second transistor and greater amounts of signal current above said predetermined frequency conduct through said second transistor than conduct through said first transistor and means for deriving an output signal from said signal current passing into said second transistor.

2. The circuit of claim 1 wherein the transconductance of said first transistor is at least 30 times greater than the transconductance of said second transistor.

3. The circuit of claim 1 wherein said means operative to govern the transconductance includes a difference in gate oxide thickness between said first and second transistors.

4. The circuit of claim 1 wherein said means operative to govern the transconductance includes a difference in potential between said gate voltage sources of said first and second transistors.

5. The circuit of claim 1 wherein said means operative to govern the transconductance includes a difference in the gate periphery of said first and second transistors.

6. The circuit of claim 1 wherein said body of said first transistor is electrically isolated from other semiconductor material except its source and drain to allow the potential of the body to follow the potential of said source of said first transistor.

7. A circuit for providing an output signal above a predetermined frequency in response to an input signal that may include portions having a frequency below such predetermined frequency, comprising:
    means for coupling to an input signal;
    a first field effect transistor having a source, drain, gate and body;
    a second field effect transistor having a source, gate and body;
    said source and body of said first transistor and said source of said second transistor being commonly coupled to said input signal coupling means;
    said gate of said first transistor having a predetermined capacitance and coupled through a switch to its respective gate voltage source;
    said switch responsive to a control signal for turning on and off said switch at said predetermined frequency;
    said drain of said first transistor coupled through a second resistor to a drain voltage source;
    said gate of said second field effect transistor coupled to its respective gate voltage source;
    means operative to govern the transconductance of said first transistor to be greater than the transconductance of said second transistor whereby greater amounts of signal current below said predetermined frequency conduct through said first transistor than conduct through said second transistor and greater amounts of signal current above said predetermined frequency conduct through said second transistor than conduct through said first transistor and means for deriving an output signal from said signal current passing into said second transistor.

8. The circuit of claim 7 wherein said switch includes a transistor.

9. The circuit of claim 8 wherein said transistor is of the field effect type.

* * * * *